(12) United States Patent
Selle

(10) Patent No.: US 9,581,182 B2
(45) Date of Patent: Feb. 28, 2017

(54) FURNITURE CONNECTION BRACKET

(71) Applicant: STAFAST PRODUCTS, INC., Painesville, OH (US)

(72) Inventor: Stephen R. Selle, Mentor, OH (US)

(73) Assignee: STAFAST PRODUCTS, INC., Painesville, OH (US)

( * ) Notice: Subject to any disclaimer, the term of this patent is extended or adjusted under 35 U.S.C. 154(b) by 0 days.

(21) Appl. No.: 14/723,646

(22) Filed: May 28, 2015

(65) Prior Publication Data

US 2016/0348705 A1    Dec. 1, 2016

(51) Int. Cl.
| H05K 5/02 | (2006.01) |
| F16B 12/10 | (2006.01) |
| F16B 2/22 | (2006.01) |
| B60R 11/00 | (2006.01) |

(52) U.S. Cl.
CPC .............. *F16B 12/10* (2013.01); *B60R 11/00* (2013.01); *F16B 2/22* (2013.01); *H05K 5/0204* (2013.01)

(58) Field of Classification Search
CPC ............. G06F 1/187; F16B 12/10; F16B 2/22; B60R 2011/0071; F16M 11/10; F16M 11/2021; F16M 11/2092; F16M 11/38; F16M 2200/044; F16M 2200/08; Y10T 29/24; H05K 5/0204
USPC ............... 248/222.11, 235, 250, 247, 228.3, 230.3,248/230.5, 231.41, 220.21, 220.22, 222.13,248/223.41, 224.61, 224.7, 225.11, 27.1, 27.3,248/298; 312/333, 334.7, 334.8, 334.46, 334.44
See application file for complete search history.

(56) References Cited

U.S. PATENT DOCUMENTS

| | | | | |
|---|---|---|---|---|
| 3,337,172 A * | 8/1967 | Jackson | ............... | A47B 96/068 248/222.51 |
| 3,403,641 A * | 10/1968 | Baker | .................. | A47B 47/042 108/152 |
| 3,932,016 A * | 1/1976 | Ammenheuser | ..... | H05K 7/1418 361/801 |
| 4,148,454 A * | 4/1979 | Carlson | .................. | F16B 12/38 108/152 |
| 4,199,200 A * | 4/1980 | Livingston | ......... | A47B 88/0407 312/334.18 |
| 4,998,828 A * | 3/1991 | Hobbs | .................... | A47B 88/10 312/334.46 |
| 5,262,923 A * | 11/1993 | Batta | .................. | A47B 88/0451 312/333 |
| 5,542,759 A * | 8/1996 | Krivec | .................. | A47B 88/10 312/333 |
| 5,683,159 A * | 11/1997 | Johnson | .................. | G06F 1/187 312/223.2 |
| 5,806,949 A * | 9/1998 | Johnson | ................. | G06F 1/187 312/223.2 |

(Continued)

*Primary Examiner* — Nkeisha Smith
(74) *Attorney, Agent, or Firm* — Woodling, Krost and Rust

(57) ABSTRACT

A connection bracket and a support couples with a male bracket. The connection bracket includes: a first end portion and a second end portion; an opening in the first end portion; a central body extending between the first end portion and the second end portion; a first guide and a second guide; the first guide integral with the central body and being folded to form an open channel, and the second guide integral with the central body and being folded to form the open channel. First and second spacers integral with the central body include first and second passageways therethrough. The central body includes an opening and a spring-loaded latch which extends from the central body into the opening and is movable with respect to the central body and the opening and secures the male bracket to the connection bracket.

11 Claims, 11 Drawing Sheets

(56) References Cited

U.S. PATENT DOCUMENTS

| | | | | |
|---|---|---|---|---|
| 6,443,320 B1* | 9/2002 | Herzog | A47B 57/50 | 211/192 |
| 6,494,550 B1* | 12/2002 | Chen | A47B 88/044 | 312/334.5 |
| 6,588,866 B2* | 7/2003 | Cheng | G11B 33/128 | 312/330.1 |
| 6,600,648 B2* | 7/2003 | Curlee | G06F 1/184 | 312/334.7 |
| 6,652,050 B2* | 11/2003 | Lin | A47B 88/047 | 312/333 |
| 6,705,689 B2* | 3/2004 | Chen | A47B 88/10 | 312/333 |
| 6,805,418 B2* | 10/2004 | Milligan | A47B 88/08 | 312/333 |
| 6,816,388 B2* | 11/2004 | Junkins | H05K 7/1418 | 361/727 |
| 6,853,549 B2* | 2/2005 | Xu | G06F 1/187 | 211/26 |
| 6,926,377 B2* | 8/2005 | Lammens | A47B 88/08 | 312/333 |
| 6,979,067 B2* | 12/2005 | Yang | A47B 88/04 | 312/333 |
| 7,090,319 B2* | 8/2006 | Milligan | A47B 88/16 | 312/334.44 |
| 7,218,512 B2* | 5/2007 | Han | G06F 1/187 | 248/222.11 |
| 7,604,307 B2* | 10/2009 | Greenwald | A47B 88/08 | 312/333 |
| 7,780,254 B2* | 8/2010 | Wang | A47B 88/12 | 108/143 |
| 7,794,031 B2* | 9/2010 | Hsiung | A47B 88/16 | 312/333 |
| 8,820,863 B2* | 9/2014 | Chen | H05K 7/1489 | 312/334.5 |
| 8,967,565 B2* | 3/2015 | Chen | A47B 88/044 | 211/192 |
| 9,211,008 B2* | 12/2015 | Chen | A47B 88/14 | |
| 2004/0075978 A1* | 4/2004 | Chen | G06F 1/187 | 361/679.33 |
| 2008/0218046 A1* | 9/2008 | Rechberg | A47B 88/10 | 312/334.11 |
| 2014/0265792 A1* | 9/2014 | Chiu | A47B 88/16 | 312/334.44 |

* cited by examiner

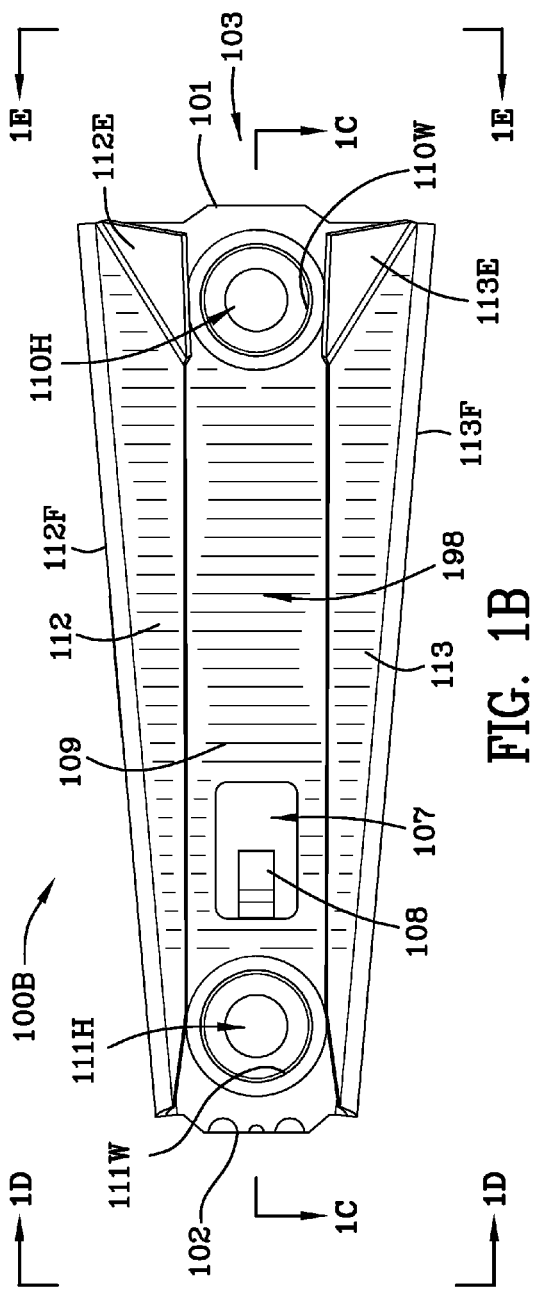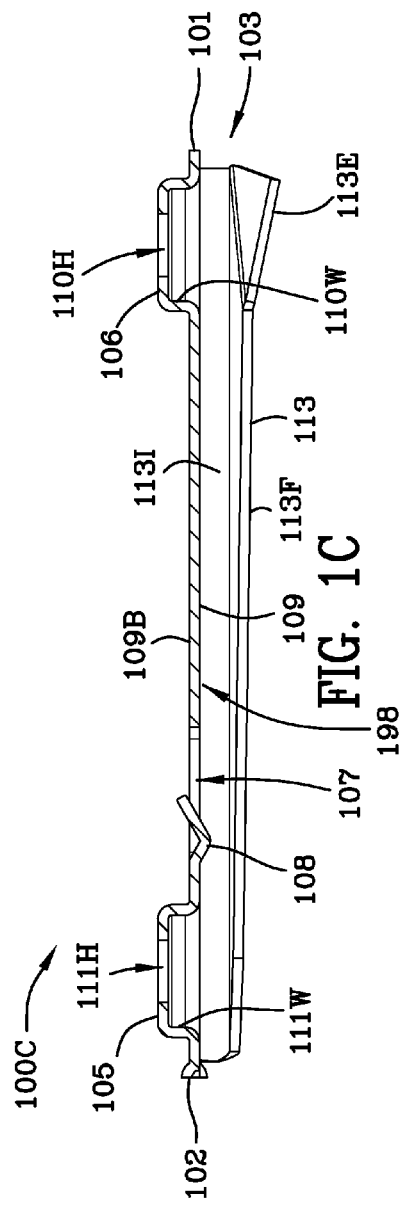

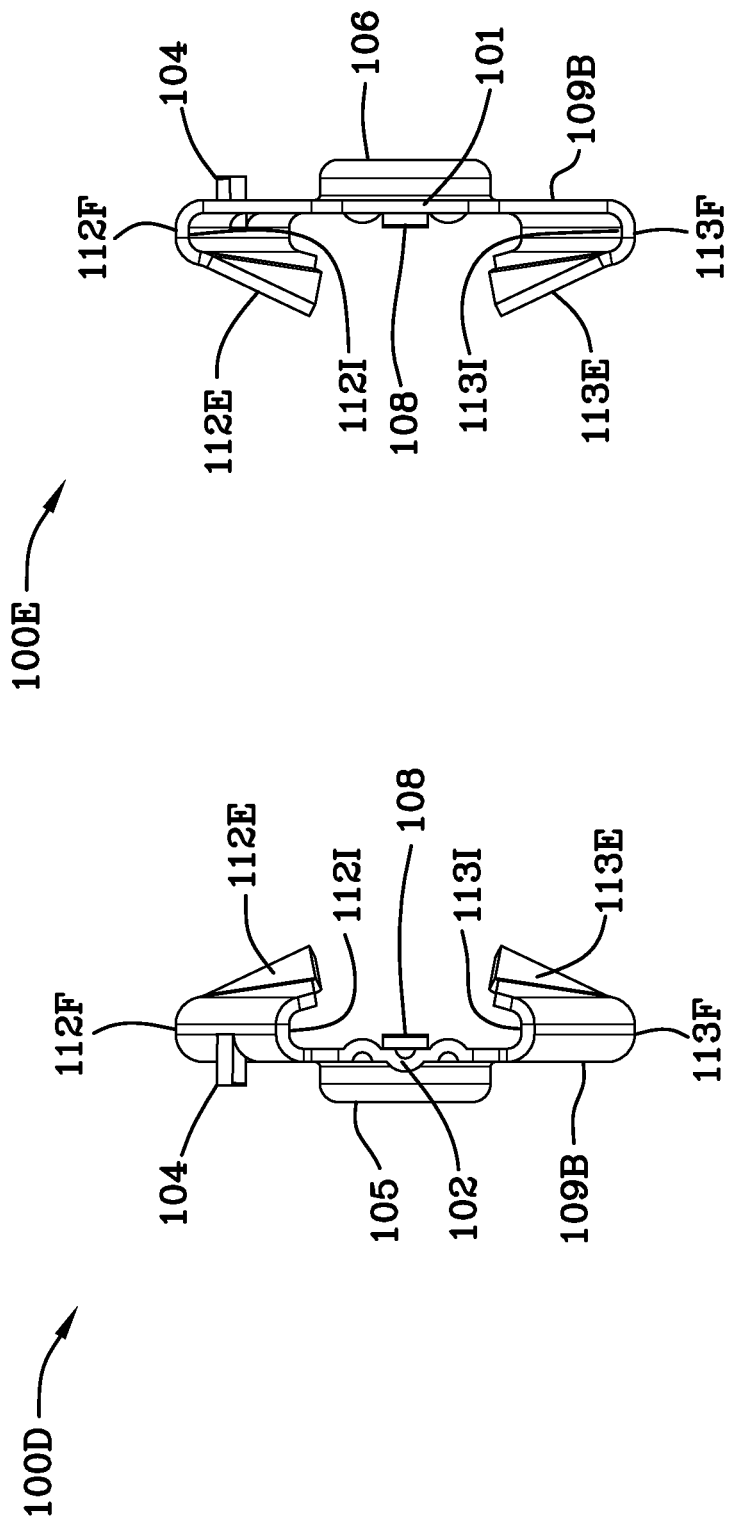

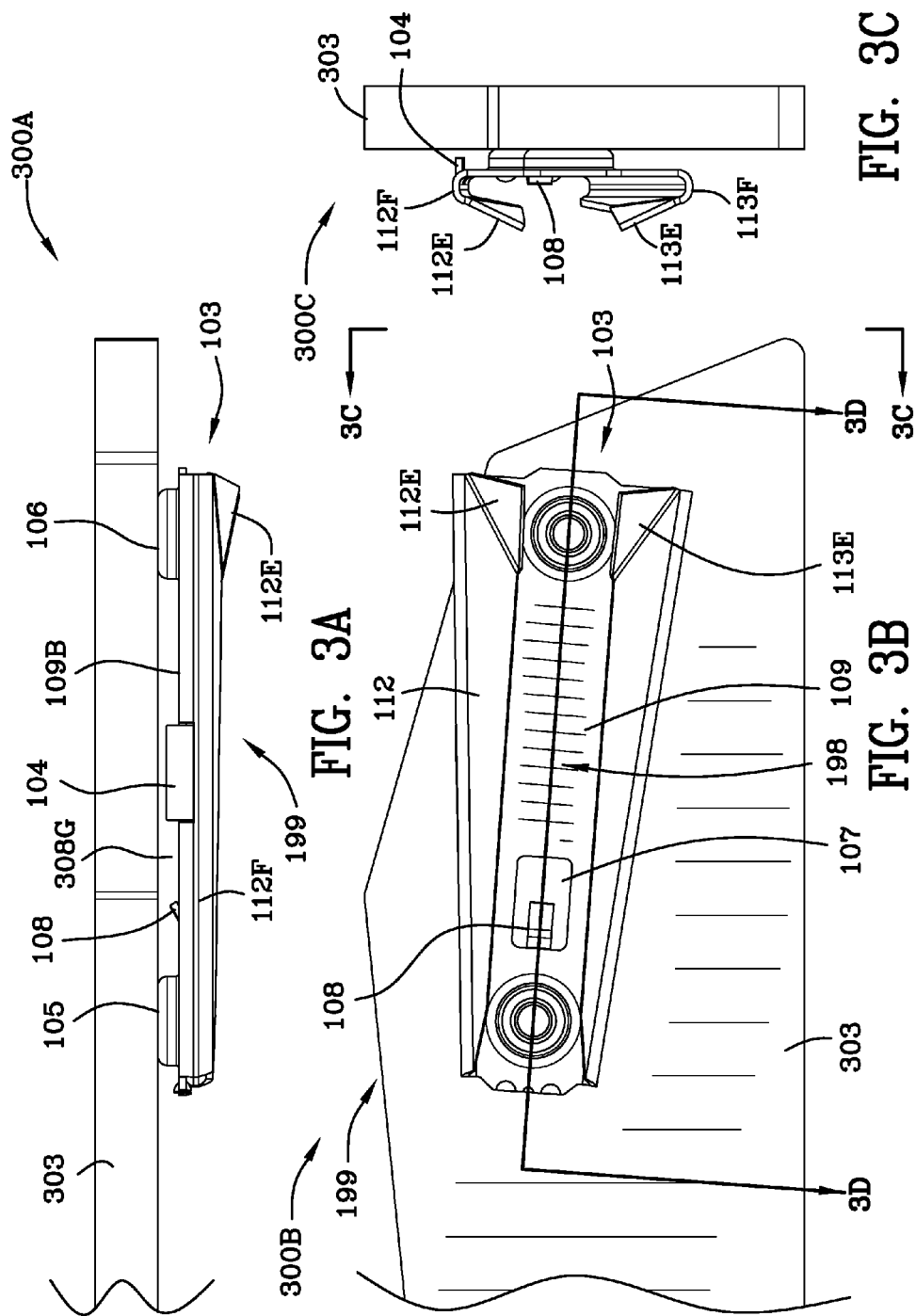

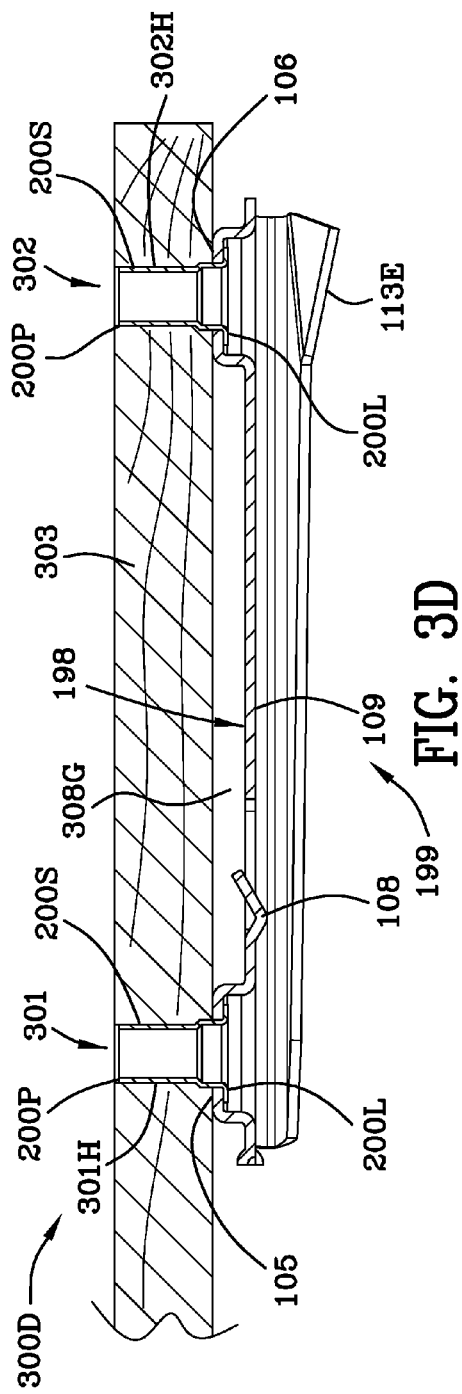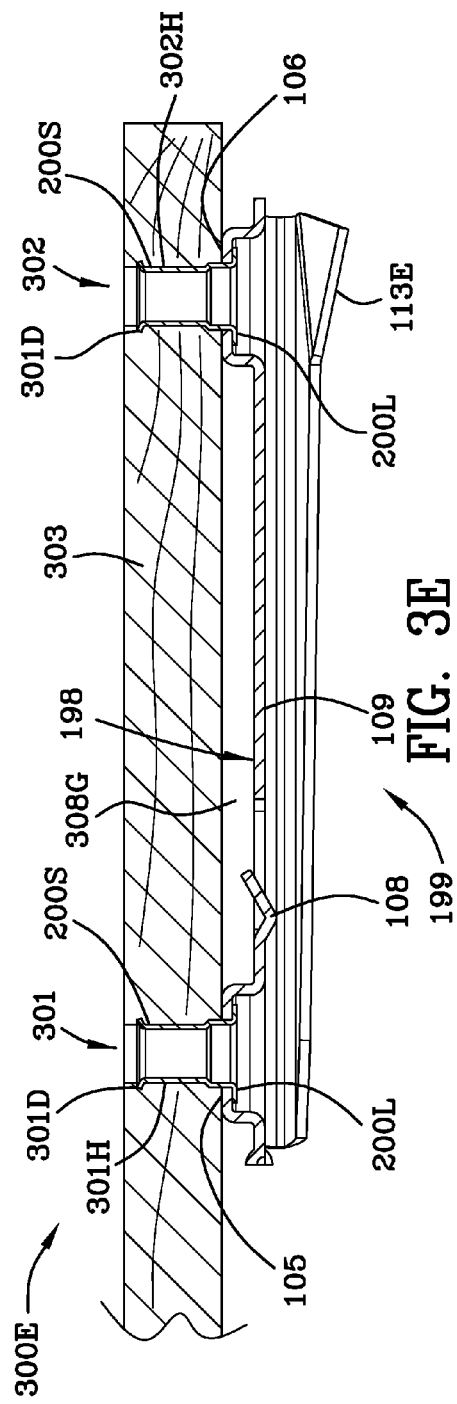

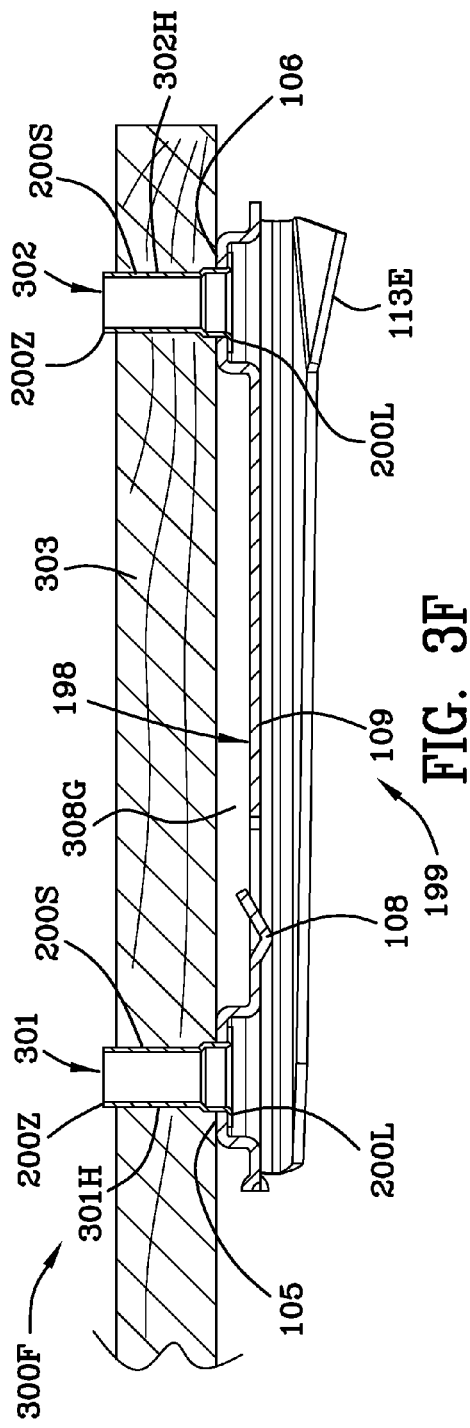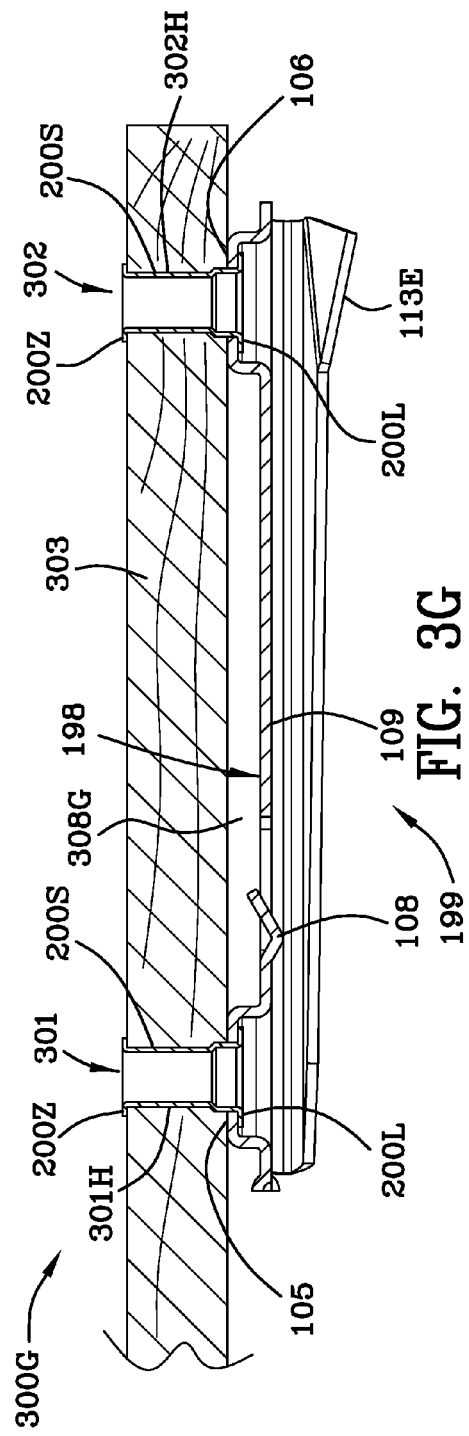

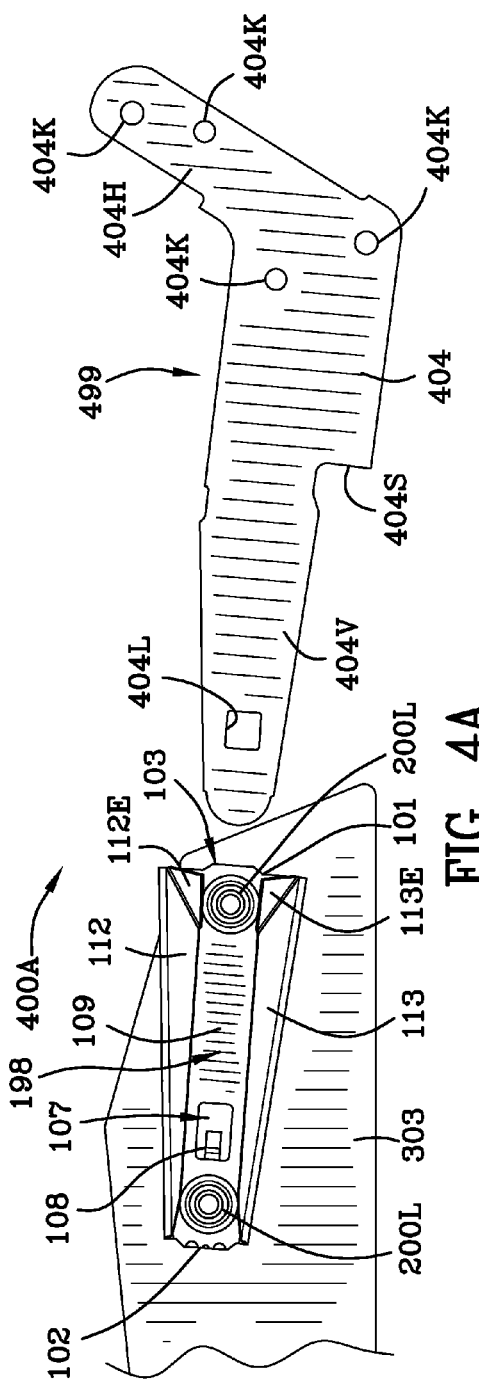
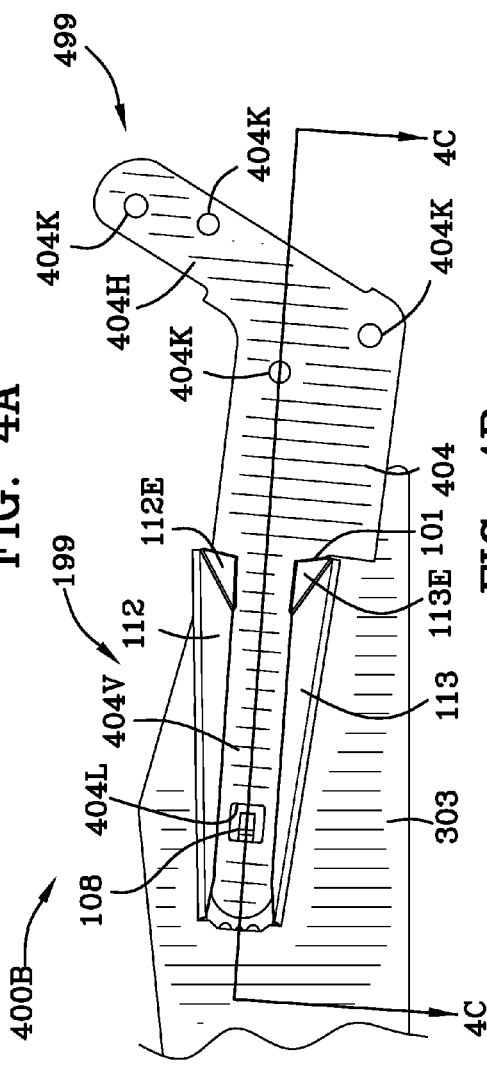
FIG. 4A
FIG. 4B

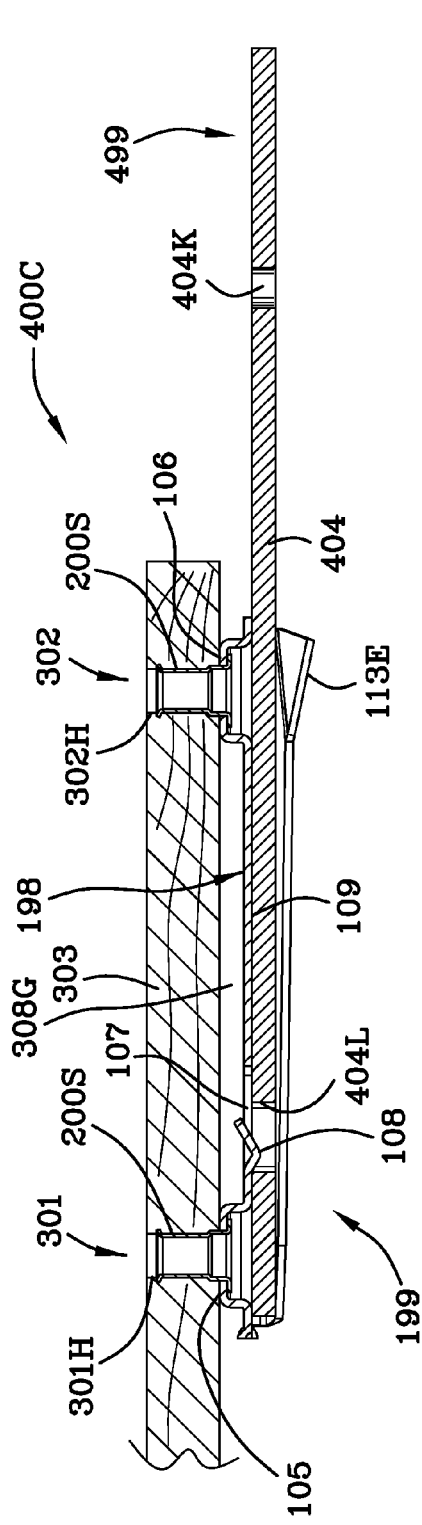
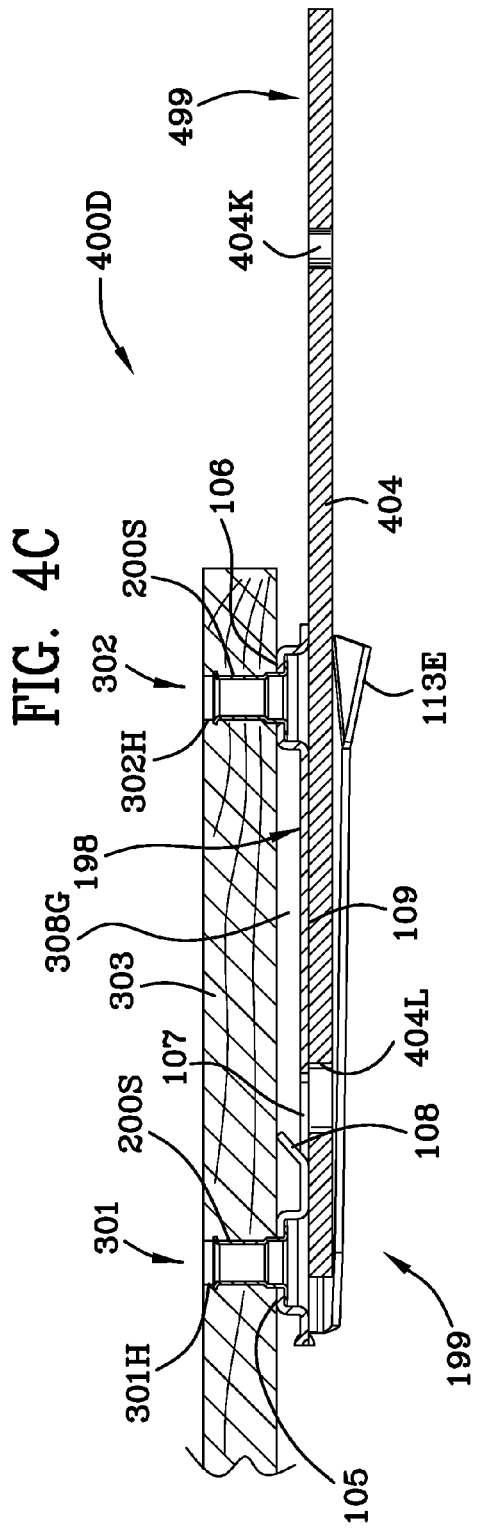

FURNITURE CONNECTION BRACKET

FIELD OF THE INVENTION

This invention is in the field of furniture connection brackets.

BACKGROUND OF THE INVENTION

This invention relates to furniture packaging for later assembly. There is a need to transport/ship components of furniture such as the back support for later assembly with the remaining structure. To do this efficiently, a furniture connection bracket is needed which is easy to assemble and use.

SUMMARY OF THE INVENTION

A connection bracket (female connection bracket) and a support. The connection bracket is a female connection bracket which receives a male connection bracket. The connection bracket includes: a first end portion and a second end portion; an opening in the first end portion; a central body extending between the first end portion and the second end portion; a first guide and a second guide; the first guide integral with the central body and being folded to form an open channel; the second guide integral with the central body and being folded to form the open channel; the first guide includes a first wing portion residing at the first end portion of the connection bracket; the second guide includes a second wing portion residing at the second end portion of the connection bracket; a first spacer integral with the central body, and the first spacer includes a first passageway therethrough; a second spacer integral with the central body, and the second spacer includes a second passageway therethrough; an opening in the central body, the central body includes a spring-loaded latch extending therefrom; and, the latch being spring loaded and movable with respect to the central body and the opening in the central body.

The support includes: a first hole therein and a second hole therein; the first hole in the support is aligned with the first passageway of the first spacer of the connection bracket; and, the second hole in the support is aligned with the second passageway of the second spacer of the connection bracket.

A first rivet and a second rivet are used to secure the connection bracket to the support. The first rivet resides in and engages the first passageway of the first spacer of the connection bracket and, the first rivet resides in and engages the first hole of the support. The second rivet resides in and engages the second passageway of the second spacer of the connection bracket and, the second rivet resides in and engages the second hole of the support. The first rivet being deformed into the support and immovable with respect to the support securing the connection bracket to the support. The second rivet being deformed into the support and immovable with respect to the support securing the connection bracket to the support.

The central body includes a back side and the first spacer integral with the central body protrudes therefrom a distance from the back side of the central body. The second spacer integral with the central body protrudes therefrom a distance from the back side of the central body. The first spacer integral with the central body engages the support and the second spacer integral with the central body engages the support. The back side of the central body is spaced apart from the support enabling the latch to be depressed into the space. The central body includes a back side and the first spacer integral with the central body protrudes therefrom a distance from the back side of the central body and the second spacer integral with the central body protrudes therefrom a distance from the back side of the central body. The first spacer integral with the central body engages the support and the second spacer integral with the central body engages the support. A grip integral with the central body protrudes therefrom a distance from the back side of the central body. The grip resides between the first spacer integral with the central body and the second spacer integral with the central body. The grip integral with the central body does not engage the support. The grip assists in the installation of the connection bracket. The back side of the central body is spaced apart from the support enabling the spring-loaded latch to be depressed into the space/gap between the connection bracket and the support.

The first guide and the second guide form a slot. The support includes first and second sides. The first rivet includes a lip and a distal end and the lip engages the first spacer of the connection bracket. The distal end of the first rivet is deformed into the support and the first rivet is immovable with respect to the support securing the connection bracket to the support. The second rivet includes a lip and a distal end and the lip engages the second spacer of the connection bracket and the distal end of the second rivet is deformed into the support. The second rivet is immovable with respect to the support securing the connection bracket to the support.

The first guide and the second guide form a channel/slot as stated above. The spring-loaded latch extends from the central body into the channel and the spring-loaded latch further extends into the opening in the central body. The spring-loaded latch engages a male bracket which has an opening therein. The opening of the male bracket receives and engages the latch when the male bracket is fully inserted into the channel of the female connection bracket. As the male bracket enters the female connection bracket, the spring-loaded latch is depressed and moves into the gap between the connection bracket and the support. As the movement of the male bracket continues the spring-loaded latch of the female connection bracket enters an opening in the male bracket.

It is an object of the present invention to provide a female connection bracket which is easily and securely latchable and unlatchable with a male bracket.

It is an object of the present invention to provide a female connection bracket which is which enables storage and shipment of component furniture parts.

BRIEF DESCRIPTION OF THE DRAWINGS

FIG. 1B is front view of the connection bracket.

FIG. 1C is a cross-sectional view of the connection bracket taken along the lines 1C-1C of FIG. 1B.

FIG. 1D is an end view of the connection bracket from the perspective of lines 1D-1D of FIG. 1B.

FIG. 1E is an end view of the connection bracket from the perspective of lines 1E-1E of FIG. 1B.

FIG. 3A is a top view of the connection bracket attached to the support member.

FIG. 3B is a front view of the connection bracket attached to the support member.

FIG. 3C is an end view of the connection bracket loosely affixed, but not riveted, to the support from the perspective of lines 3C-3C of FIG. 3B.

FIG. 3D is a cross sectional view of the connection bracket and the support member with the rivets not yet fixed together taken along the lines 3D-3D of FIG. 3B.

FIG. 3E cross sectional view of the connection bracket affixed/riveted to the support member with the rivets deformed into the support member.

FIG. 3F is a cross-sectional view of the connection bracket and the support member not yet affixed/riveted together illustrating the end of the barrel of the first and second rivets extending outside the support member.

FIG. 3G is a cross-sectional view of the connection bracket and the support member affixed/riveted to the support member with the rivets deformed outside the support member.

FIG. 4A is an enlarged frontal view of the connection bracket affixed to a support member with a male bracket aligned for entry into the connection bracket.

FIG. 4B is an enlarged frontal view of the connection bracket affixed to the support member with a male bracket member inserted therein.

FIG. 4C is a cross sectional view of the connection bracket affixed to the support member with the male bracket inserted therein taken along the lines 4C-4C of FIG. 4B.

FIG. 4D is a cross sectional view of the connection bracket affixed to the support member with the male bracket partially inserted therein taken along the lines 4C-4C of FIG. 4B.

DESCRIPTION OF THE INVENTION

Figure 1:
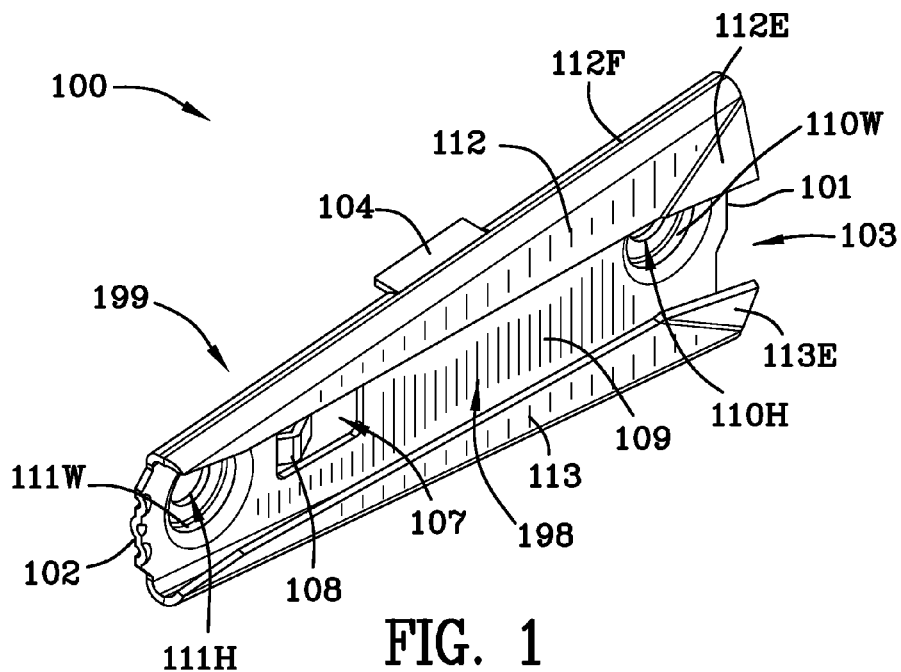
FIG. 1 is a front perspective view of the connection bracket.

FIG. 1 is a front perspective view 100 of the tapered connection bracket 199. Connection bracket 199 includes first end 101 and second 102, serrated and tapered end. FIG. 1 illustrates a channel/slot in connection bracket 199. First end 101 of the connection bracket 199 is wider than second end 102 of the connection bracket 199 and, therefore, the connection bracket is tapered from the first end to the second end. Connection bracket 199 includes grip 104 on the back side of the connection bracket 199, second end spacer 105 on the back side of the connection bracket 199, and first spacer 106 on the back side of the connection bracket 199. Opening 107 in central body surface 109 as well as spring-loaded latch 108 protruding upwardly from surface 109 of the central body 198 of the connection bracket 199 are illustrated in FIG. 1. Spring-loaded latch 108 is v-shaped in cross section as illustrated in FIG. 1C and it is the v-shape which provides the spring-loaded action of the latch 108 such that as latch 108 is depressed it will return to its original position. FIG. 4D illustrates spring-loaded latch 108 depressed as male bracket 499 enters channel/slot 103. See FIGS. 1 and 1A indicating the channel slot 103.

Spring-loaded latch 108 as used herein does not denote the use of spring steel. Latch 108 is not spring steel which has been heat treated such that it always returns it previous position like springs do. It is formed steel which has a memory like all materials do and wants to naturally return to its original shape. The geometry of latch 108 is formed in such a way to enhance its tendency to return to its original shape and for the most part it does but over time and with multiple installs (over 10 times) it starts to deform. Most chairs/furniture applications are not taken apart and re-assembled that many times.

Reference numeral 109 is the front surface of the connection bracket 199 and reference numeral 109B is the back surface/back side of the connection bracket 199. Arrow 110H indicates a hole/passageway in front surface 109 which extends through first spacer 106. Reference numeral 110W indicates a wall in first spacer 106 forming hole/passageway 110H. Arrow 111H indicates a hole/passageway in front surface 109 which extends through second spacer 105. Reference numeral 111W indicates the wall in second spacer 105 forming the hole/passageway 110W.

Still referring to FIG. 1, first guide 112 and entrance wing 112E on the first guide 112 are illustrated. Folded portion 112F of first guide extends from the back surface 109B of the central body 198 to the first guide 112. Second guide 113 and entrance wing 113E on the second guide 113 are illustrated. Folded portion 113F of second guide 113 extend from the back surface 109B to the second guide 113.

Figure 1A:
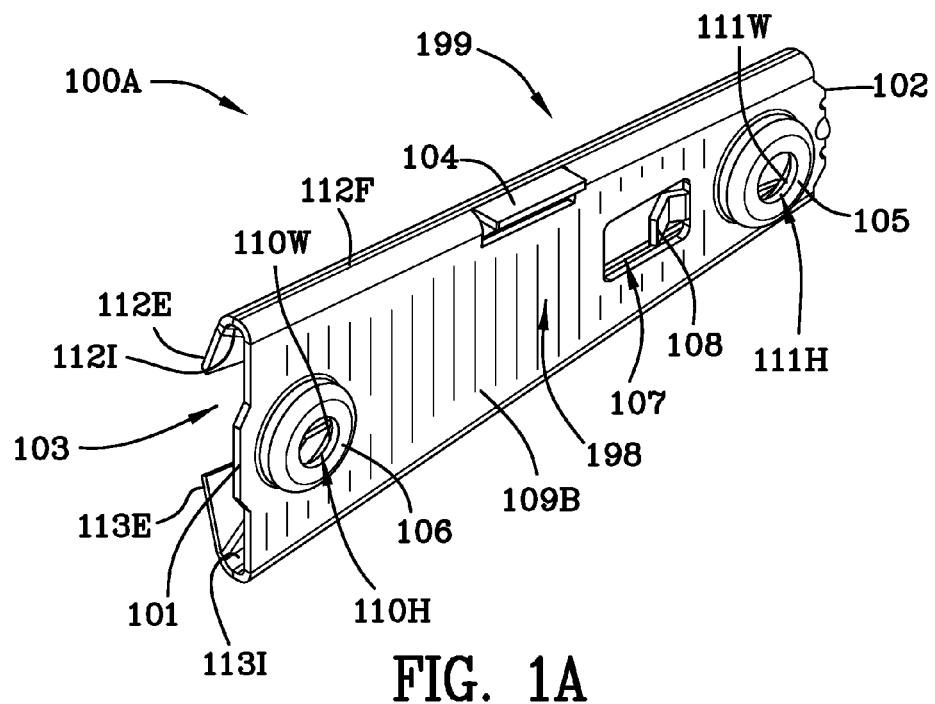
FIG. 1A is a rear perspective view of the connection bracket.

FIG. 1A is a rear perspective view 100A of the connection bracket 199. Inner surface 113I of folded portion 113F and inner surface 112I of folded portion 112F are illustrated. Arrow 199 indicates the tapered connection bracket which tapers from the first end 101 to the second end 102. The central body 198 of the tapered connection bracket 199 is illustrated in FIGS. 1A and 1B.

Figure 4:
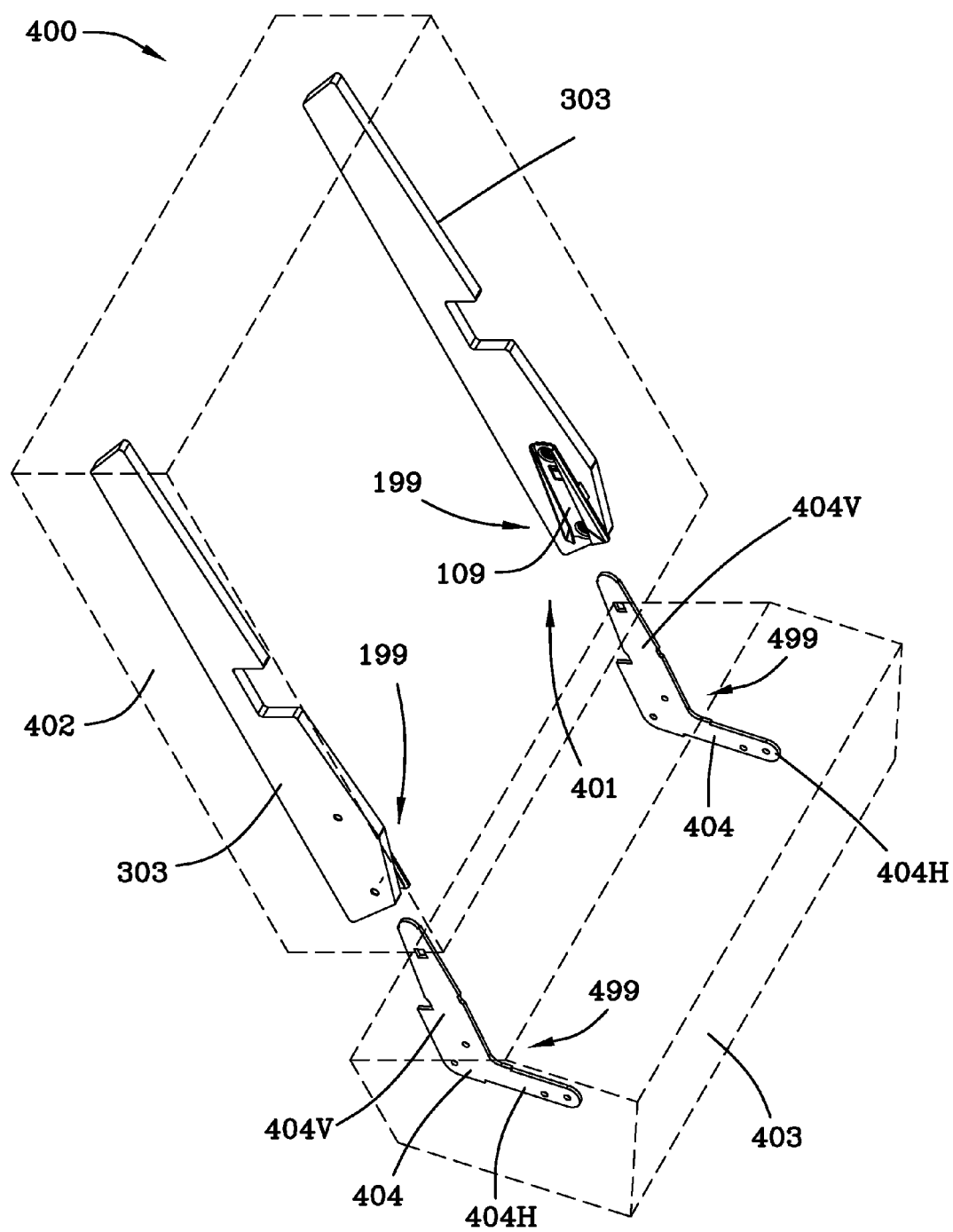
FIG. 4 is a perspective view of the connection bracket affixed to a support member with male bracket members aligned for entry into the connection bracket.

FIG. 1B is front view 100B of the connection bracket 199. FIG. 1C is a cross-sectional view 100C of the connection bracket 199 taken along the lines 1C-1C of FIG. 1B. The first guide 112 and the second guide 113 form a channel/slot 103 as stated above for the reception and interlocking of the male bracket 499. The spring-loaded latch 108 extends from the central body into the channel and the spring-loaded latch further extends into the opening in the central body. The spring-loaded latch 108 is v-shaped in cross-section as illustrated in FIG. 1C and extends from the central body 198 into the channel/slot 103 and further extends into the opening 107 in the central body 198. Channel/slot 103 receives the male bracket 499 as illustrated in FIGS. 4 et seq.

FIG. 1D is an end view 100D of the connection bracket 199 from the perspective of lines 1D-1D of FIG. 1B. FIG. 1E is an end view 100D of the connection bracket 199 from the perspective of lines 1E-1E of FIG. 1B. Folded 112F, 113F of the guides 112, 113 are illustrated in FIGS. 1C and 1D as are the respective inner portions 112I, 113I.

Figure 2:
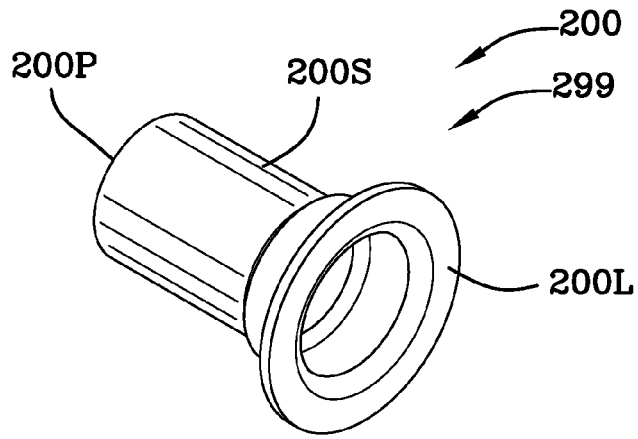
FIG. 2 is a perspective view of the rivet.

FIG. 2 is a perspective view 200 of the generally cylindrically shaped rivet 299. The materials of the female connection bracket 199 and the male bracket 499 may be steel, stainless steel or plastic. Usually steel will be used. The materials of the rivet are also steel, stainless steel or plastic. Usually, stainless steel will be used. The material of the support member may be wood, plastic or metal. Usually, wood will be used as the support member. Pressboard or plywood may be used.

Figure 2A:
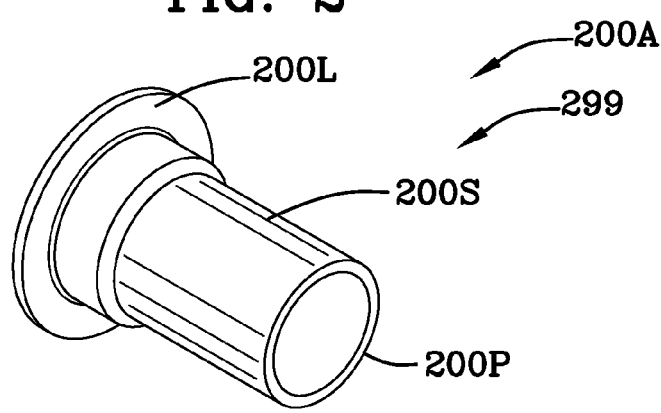
FIG. 2A is another perspective view of the rivet.
Figure 2B:
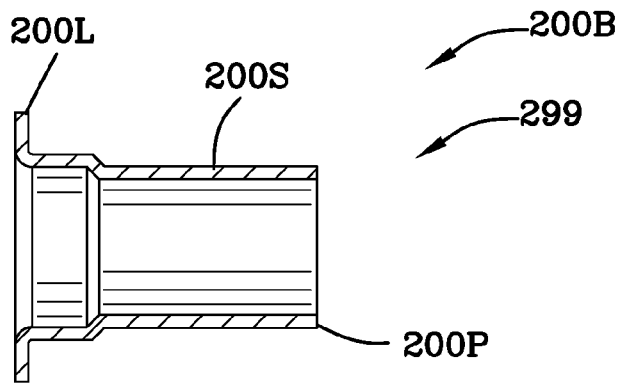
FIG. 2B is a cross-sectional view of the rivet.

FIG. 2A is another perspective view 200A of the rivet 299. FIG. 2B is a cross-sectional view 200B of the rivet 299. Rivet 299 includes lip portion 200L, end portion 200P, and surface 200S. End portion 200P is deformed 301D into the support member 303 from the back side of the support member as illustrated in FIG. 3E. Lips 200L, 200L of the rivets 299, 299 engage the connection bracket 199 and secure it to the support 303 as illustrated in FIGS. 4C and 4D. Connection bracket 199 includes first 106 and second 105 spacers into which rivets 299, 299 are inserted. The lip 200L of each rivet 299 engages the respective spacers as shown in FIGS. 4C and 4d. The distal end portion 301D of each rivet is deformed into the support 303 to secure the connection bracket 199 to the support 303.

Figure 3:
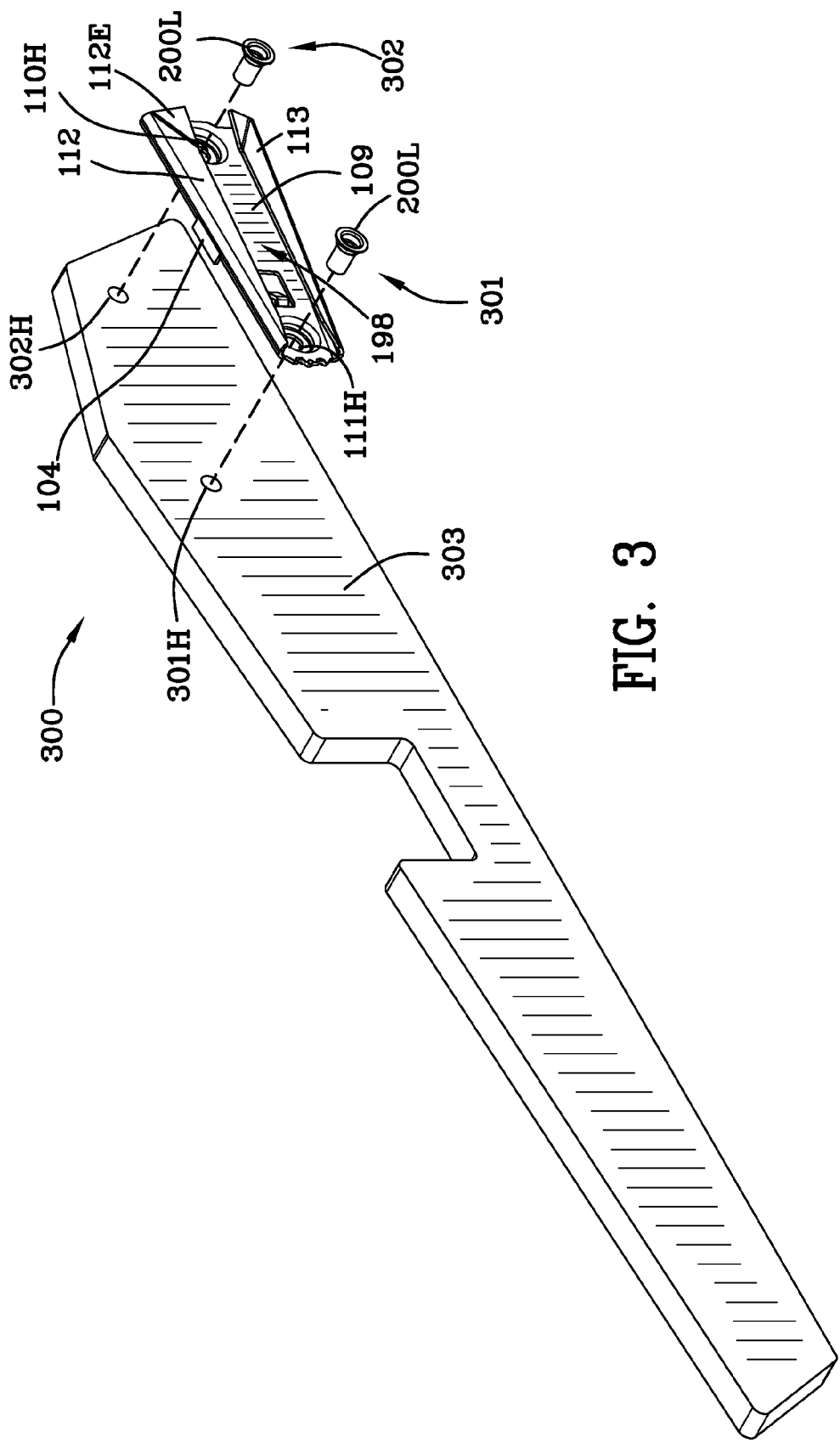
FIG. 3 is a perspective view of the connection bracket to be mounted to a support member.

FIG. 3 is a perspective view 300 of the connection bracket 199 to be mounted to a furniture support member 303. FIG. 3A is an enlarged top view 300A of the connection bracket 199 attached to the furniture support member 303. Gap 308G between the back side 109B of connection bracket 199 and the furniture support 303 is illustrated in FIG. 3A and represents the distance that the central body 198 of the connection bracket 199 is spaced apart from the furniture support 303. It also represents the clearance for operation of the latch as male bracket 499 is inserted into channel/slot 303 and engages latch 108 forcing latch 108 downwardly until opening 404L of male bracket 499 interengages and interlocks with spring-loaded latch 108. FIG. 3B is an enlarged front view 300B of the connection bracket 199 attached to the support member 303. Arrow 301 indicates a first rivet 299 aligned with hole 111H in connection bracket 199 and hole 301H in furniture support 303 which receives the first rivet. Arrow 302 indicates a second rivet 299 in hole 302H in furniture support 303. Second rivet 299G is aligned with hole 110H. See FIGS. 1 and 1A.

FIG. 3C is an end view 300C of the connection bracket 199 affixed to the support member 303 from the perspective of lines 3C-3C of FIG. 3B. FIGS. 3A and 3C illustrate the gap 308G between the furniture support 303 and the back side 109B of the connection bracket 199. FIG. 3D is a cross sectional view 300D of the connection bracket 199 and the support member 303 loosely affixed but not yet riveted together along the lines 3D-3D of FIG. 3B. Arrows 301, 302 indicate rivets inserted into the support member 303.

FIG. 3E is a cross sectional view 300E of the connection bracket 199 affixed/riveted to the support member 303 similar to FIG. 3D with the rivets 299 deformed into the support 303. Rivets 301, 302 are illustrated as being deformed 301D into furniture support 303. Deforming the rivets 299, 299 into the furniture support 303 provides a secure rivet and provides a smooth surface on the back side of the furniture support member 303. Deformation of rivets 299, 299 occurs within the respective holes 301H, 302H of support 303. The back side of the furniture support member 303 is the side opposite the connection bracket 199 and the front side of the furniture support member is the side nearest the connection bracket 199.

Referring to FIGS. 3D and 3E, lips 200L, 200L of rivets 301, 302 are illustrated in engagement with a respective spacer 105, 106 securing the spacers 105, 106 into engagement with the front side of furniture support member 303. Rivets 299, 299 are illustrated as substantially cylindrically shaped and engaging holes 301H, 302H in the furniture support 303.

FIG. 3F is a cross-sectional view 300F of the connection bracket 199 and the support member 303 not yet affixed/riveted together illustrating the end 200Z of the barrel of the first and second rivets extending outside the support member 303.

FIG. 3G is a cross-sectional view 300G of the connection bracket 199 and the support member 303 affixed/riveted to the support member 303 with the rivets deformed outside the support member.

FIG. 4 is a perspective view 400 of the connection bracket 199 affixed to a support member 303 with male bracket members 499, 499 aligned for entry into the connection bracket 199. Arrow 401 indicates insertion of the male bracket 499 into the connection bracket 199. Rear back cushion 402 and bottom cushion 403 are illustrated in phantom. Male brackets 499 include a central portion 404, a horizontal portion 404H, a vertical portion 404V, an opening 404L in the male bracket 404 which receives latch 108 of connection bracket 199, holes 404K in male bracket 499 for connecting to other furniture structure (not shown), and, a shoulder 404S on male bracket 404 which engages the first end 101 of the connection bracket 199.

FIG. 4A is an enlarged frontal view 400A of the connection bracket 199 affixed to a support member 303 with a male bracket 499 aligned for entry into the connection bracket 199. Male bracket 499 includes a vertical portion 404V which is reciprocally shaped with respect to the connection bracket 199. Opening 404L interengages with spring-loaded latch 108 as male bracket 499 is slid into channel/slot 103. FIG. 4D is a cross sectional view 400D of the connection bracket 199 affixed to support member 303 with the male bracket 499 inserted therein taken along the lines 4C-4C of FIG. 4B similar to FIG. 4C with the male bracket 499 partially inserted into channel/slot 103. FIG. 4D illustrates male bracket 499 in engagement with the spring-loaded latch 108 depressing the latch in gap 308G. As male bracket 499 progresses further leftwardly, then spring-loaded latch 108 enters opening 107. See FIGS. 4B and 4C. FIG. 4B is an enlarged frontal view 400B of the connection bracket 199 affixed to the support member 303 with a male bracket 499 fully inserted therein. FIG. 4C is a cross sectional view 400C of the connection bracket affixed to the support member 303 with the male bracket fully inserted therein taken along the lines 4C-4C of FIG. 4B.

As previously stated, a connection bracket 199, a support 303 and a male bracket 499 are used to secure members of furniture together. The connection bracket 199 includes: a first end portion 101 and a second end portion 102; a channel/slot 103 in the first end portion 101; a central body 198 extending between the first end portion 101 and the second end portion 102; a first guide 112 and a second guide 113; the first guide 112 is integral with the central body 198 and is folded 112F to form an open channel; the second guide 113 is integral with the central body and is folded to form an open channel; the first guide 112 includes a first wing portion 112E residing at the first end portion 101 of the connection bracket 199; the second guide 113 includes a second wing portion 113E residing at the first end portion of the connection bracket 199; a first spacer 106 integral with the central body 198, and the first spacer 106 includes a first passageway 110H therethrough; a second spacer 105 integral with the central body 198, and the second spacer 105 includes a second passageway 111H therethrough; an opening 107 in the central body 198, the central body 198 includes a spring-loaded latch 108 extending therefrom; and, the latch 108 is spring loaded and movable with respect to the central body 198 and the opening 107 in the central body 198.

The support 303 includes: a first hole 301H therein and a second hole 302H therein; the first hole 301H in the support is aligned with the first passageway 111H of the first spacer 106 of the connection bracket 199; and, the second hole 302H in the support 303 is aligned with the second passageway 110H of the second spacer 105 of the connection bracket 199.

A first rivet 301 and a second rivet 302 are used to secure the connection bracket 199 to the support 303. The first rivet 301 resides in and engages the first passageway of the first spacer of the connection bracket and, the first rivet 301 resides in and engages the first hole 301H of the support. The second rivet 302 resides in and engages the second passageway of the second spacer of the connection bracket and, the second rivet 302 resides in and engages the second hole 302H of the support. The first rivet is deformed 301D into the support and immovable with respect to the support securing the connection bracket to the support. The second rivet is deformed 301D into the support and immovable with respect to the support securing the connection bracket to the support.

The central body 198 includes a back side and the first spacer 106 integral with the central body 198 protrudes therefrom a distance 308G from the back side of the central body. The second spacer 105 integral with the central body 198 protrudes therefrom a distance 308G from the back side of the central body. The first spacer 106 integral with the central body engages the support 303 and the second spacer integral with the central body engages the support. The back side of the central body is spaced apart 308G from the support enabling the spring-loaded latch 108 to be depressed into the space. A grip 104 integral with the central body protrudes therefrom a distance from the back side of the central body. The grip resides between the first spacer 106 integral with the central body and the second spacer 105 integral with the central body 198. The grip 104 integral with the central body 198 does not engage the support. The back side of the central body is spaced apart from the support enabling the spring-loaded latch to be depressed into the space 308G.

The first guide and the second guide form a slot 103. The support 303 includes first and second sides. The first rivet includes a lip 200L and a distal end 220P and the lip engages the first spacer 106 of the connection bracket. The distal end of the first rivet 301 is deformed 301D into the support and the first rivet 301 is immovable with respect to the support securing the connection bracket 199 to the support. See FIG. 3E. The second rivet 302 includes a lip 200L and a distal end 200P and the lip 200L engages the second spacer 105 of the connection bracket and the distal end of the second rivet is deformed 301D into the support 303. The second rivet 302 is immovable with respect to the support 303 securing the connection bracket 199 to the support 303. The spring-loaded latch 108 extends from the central body 198 into the channel 103 and the spring-loaded latch 108 further extends into the opening 107 in the central body 198. The spring-loaded latch 108 is v-shaped in cross-section and extends from the central body 198 into the channel 103 and further extends into the opening 107 in the central body 198.

REFERENCE NUMERALS 100 front perspective view of connection bracket 199
100A rear perspective view of connection bracket 199
100B front view of connection bracket 199
100C cross-sectional view of connection bracket 199 taken along the liens 1C-1C of FIG. 1B
100D end view of the connection bracket 199 from the perspective of lines 1D-1D of FIG. 1B
100E end view of the connection bracket 199 from the perspective of lines 1E-1E of FIG. 1B
101 first end of the connection bracket 199
102 second, serrated and tapered end of connection bracket 199
103 channel/slot in connection bracket 199
104 grip on the back side of the connection bracket 199 which does not engage support 303
105 second spacer on the back side of the connection bracket 199
106 first spacer on the back side of the connection bracket 199
107 opening in surface 109
108 spring-loaded latch protruding upwardly from surface 109 of the connection bracket 199
109 surface of the connection bracket 199
109B back surface/back side of the connection bracket 199
110H arrow indicating hole/passageway in surface 109 which extends through first spacer 106
110W wall in first end support forming hole/passageway 110H
111H arrow indicating hole/passageway in surface 109 which extends through second spacer 105
111W wall in second end support forming hole/passageway 110W
112 first guide
112E entrance wing on first guide 112
112F folded portion of first guide extending from the back surface 109B to the first guide 112
112I inner surface of folded portion 112F
113 second guide
113E entrance wing on second guide 113
113F folded portion of second guide extending from the back surface 109B to the second guide 113
113I inner surface of folded portion 113F
198 central body of the connection bracket 199
199 arrow indicating tapered connection bracket 199
200 perspective view of the rivet
200A another perspective view of the rivet
200B cross-sectional view of the rivet
200L lip of rivet 299
200P end portion of rivet 299
200S surface of rivet
299 generally cylindrically shaped rivet
300 perspective view of the connection bracket to be mounted to a support bracket
300A top view of the connection bracket attached to the support member
300B front view of the connection bracket attached to the support member
300C end view of the connection bracket affixed to the support from the perspective of lines 3C-3C
300D cross sectional view of the connection bracket and the support affixed therebetween along the lines 3D-3D of FIG. 3B
300E cross sectional view of the connection bracket affixed to the support member similar to FIG. 3D with the rivets deformed into the support
301 arrow indicating a first rivet aligned with hole 111H in connection bracket 199 and hole 301H in support 303
301H hole in support 303 which receives a rivet
302 arrow indicating
302H hole in support 303 which receives a rivet
303 furniture support
308G gap between the back side 109B and the furniture support 303
400 perspective view of the connection bracket affixed to a support with male bracket members aligned for entry into the connection member
400A enlarged frontal view of the connection bracket affixed to a support with a male bracket aligned for entry into the connection member
400B enlarged frontal view of the connection bracket affixed tot he support with a male bracket member inserted therein 400C cross sectional view of the connection bracket affixed to the support with the male bracket asserted therein taken along the lines 4C-4C of FIG. 4B
400D cross sectional view of the connection bracket affixed to the support with the male bracket asserted therein taken along the lines 4C-4C of FIG. 4B similar to FIG. 4C with the rivets deformed into the support
401 arrow indicating insertion of the male bracket 404 into the connection bracket 199
402 rear back cushion illustrated in phantom
403 bottom cushion illustrated in phantom
404 central portion of the male bracket
404H horizontal portion of male bracket 404
404L opening in male bracket 404 which receives latch 108 of connection bracket 199
404K holes in male bracket 404 for connecting to other furniture structure (not shown)
404S shoulder on male bracket 404 which engages the first end connection bracket
404V portion of male bracket 404 which is reciprocally shaped to connection bracket 199
499 male bracket

The invention claimed is:
1. A connection bracket and a support, comprising:
said connection bracket includes:
a first end portion and a second end portion;
an opening in said first end portion;
a central body extending between said first end portion and said second end portion;
a first guide and a second guide;
said first guide integral with said central body and being folded to form an open channel;
said second guide integral with said central body and being folded to form said open channel;
said first guide includes a first wing portion residing at said first end portion of said connection bracket;
said second guide includes a second wing portion residing at said second end portion of said connection bracket;
a first spacer integral with said central body, and said first spacer includes a first passageway therethrough;
a second spacer integral with said central body, and said second spacer includes a second passageway therethrough;
an opening in said central body;
a latch, said latch extends from said central body and is spring loaded;
said latch extends into said opening in said central body and is movable with respect to said central body and said opening in said central body;
said support includes: a first hole therein and a second hole therein;
said first hole in said support is aligned with said first passageway of said first spacer of said connection bracket and said second hole in said support is aligned with said second passageway of said second spacer of said connection bracket;
a first rivet and a second rivet;
said first rivet resides in and engages said first passageway of said first spacer of said connection bracket and, said first rivet resides in and engages said first hole of said support;
said second rivet resides in and engages said second passageway of said second spacer of said connection bracket and, said second rivet resides in and engages said second hole of said support;
said first rivet being deformed into said support and immovable with respect to said support securing said connection bracket to said support; and,
said second rivet being deformed into said support and immovable with respect to said support securing said connection bracket to said support.

2. A connection bracket and a support as claimed in claim 1, further comprising:
said central body includes a back side;
wherein said first spacer integral with said central body protrudes therefrom a distance from said back side of said central body and said second spacer integral with said central body protrudes therefrom a distance from said back side of said central body;
said first spacer integral with said central body engages said support;
said second spacer integral with said central body engages said support; and,
said back side of said central body being spaced apart from said support enabling said latch to be depressed into said space.

3. A connection bracket and a support as claimed in claim 1 wherein said first guide and said second guide form said open channel, and, said open channel is a slot.

4. A connection bracket and a support as claimed in claim 1, further comprising:
said support includes first and second sides;
said first rivet includes a lip and a distal end, said lip engages said first spacer of said connection bracket, and said distal end of said first rivet being deformed into said support, and said first rivet immovable with respect to said support securing said connection bracket to said support; and,
said second rivet includes a lip and a distal end, said lip of said second rivet engages said second spacer of said connection bracket, and said distal end of said second rivet being deformed into said support, and said second rivet immovable with respect to said support securing said connection bracket to said support.

5. A connection bracket and a support as claimed in claim 1, further comprising:
said spring-loaded latch extends from said central body into said open channel;
said spring-loaded latch further extends into said opening in said central body.

6. A connection bracket and a support as claimed in claim 1, further comprising:
said spring-loaded latch is v-shaped in cross-section and extends from said central body into said open channel and further extends into said opening in said central body.

7. A connection bracket and a support in combination with a male bracket, comprising:
said connection bracket includes:
a first end portion and a second end portion;
an opening in said first end portion;
a central body extending between said first end portion and said second end portion;
a first guide and a second guide;
said first guide integral with said central body and being folded to form an open channel;
said second guide integral with said central body and being folded to form said open channel;
said first guide includes a first wing portion residing at said first end portion of said connection bracket;

said second guide includes a second wing portion residing at said second end portion of said connection bracket;

a first spacer integral with said central body, and first spacer includes a first passageway therethrough;

a second spacer integral with said central body, and said second spacer includes a second passageway therethrough;

an opening in said central body;

a latch, said latch extends from said central body and is spring loaded;

said latch extends into said opening in said central body and is movable with respect to said central body and said opening in said central body;

said support includes: a first hole therein and a second hole therein;

said first hole in said support is aligned with said first passageway of said first spacer of said connection bracket and said second hole in said support is aligned with said second passageway of said second spacer of said connection bracket;

a first rivet and a second rivet;

said first rivet resides in and engages said first passageway of said first spacer of said connection bracket and, said first rivet resides in and engages said first hole of said support;

said second rivet resides in and engages said second passageway of said second spacer of said connection bracket and, said second rivet resides in and engages said second hole of said support;

said first rivet being deformed into said support and immovable with respect to said support securing said connection bracket to said support;

said second rivet being deformed into said support and immovable with respect to said support securing said connection bracket to said support;

said male bracket resides in said open channel formed by said first and second guides;

said male bracket includes a first opening;

said first opening of said male bracket interengaging said latch of said connection bracket retaining said male bracket with respect to said connection bracket.

8. A connection bracket and support in combination with a male bracket as claimed in claim 7, comprising:

said spring-loaded latch is v-shaped in cross-section and extends from said central body into said channel and further extends into said opening in said central body.

9. A connection bracket and support in combination with a male bracket as claimed in claim 7, further comprising:

said central body includes a back side;

wherein said first spacer integral with said central body protrudes therefrom a distance from said back side of said central body and said second spacer integral with said central body protrudes therefrom a distance from said back side of said central body;

said first spacer integral with said central body engages said support;

said second spacer integral with said central body engages said support; and, said back side of said central body being spaced apart from said support enabling said latch to be depressed into said space.

10. A connection bracket and support in combination with a male bracket as claimed in claim 7, wherein said open channel is a slot.

11. A connection bracket and support in combination with a male bracket as claimed in claim 7, further comprising:

said support includes first and second sides;

said first rivet includes a lip and a distal end, said lip engages said first spacer of said connection bracket, and said distal end of said first rivet being deformed into said support, and said first rivet immovable with respect to said support securing said connection bracket to said support; and, said second rivet includes a lip and a distal end, said lip of said second rivet engages said second spacer of said connection bracket, and said distal end of said second rivet being deformed into said support, and said second rivet immovable with respect to said support securing said connection bracket to said support.

* * * * *

UNITED STATES PATENT AND TRADEMARK OFFICE
CERTIFICATE OF CORRECTION

PATENT NO. : 9,581,182 B2
APPLICATION NO. : 14/723646
DATED : February 28, 2017
INVENTOR(S) : Selle It is certified that error appears in the above-identified patent and that said Letters Patent is hereby corrected as shown below:

In the Specification

Column 3, Line 64, after the first occurrence of "returns" delete "it" and insert -- to its -- therefor.

Column 5, Line 2, after "4C and" delete "4d" and insert -- 4D -- therefor.

Column 7, Line 55, after "taken along the" delete "liens" and insert -- lines -- therefor.

Column 8, Line 66, after "affixed" delete "tot he" and insert -- to the -- therefor.

Signed and Sealed this
Sixteenth Day of May, 2017

Michelle K. Lee
*Director of the United States Patent and Trademark Office*